United States Patent [19]

Lee

[11] Patent Number: 5,761,258
[45] Date of Patent: Jun. 2, 1998

[54] PHASE LOCKED LOOP (PLL) CIRCUIT

[75] Inventor: Yong Won Lee, Seoul, Rep. of Korea

[73] Assignee: LG Semicon Co., Ltd., Cheongju, Rep. of Korea

[21] Appl. No.: 847,336

[22] Filed: Apr. 23, 1997

[30] Foreign Application Priority Data

Aug. 5, 1996 [KR] Rep. of Korea ............... 15060/1996

[51] Int. Cl.⁶ .................................................. H03D 3/24
[52] U.S. Cl. ................................................... 375/376
[58] Field of Search .................................. 375/376, 375;
331/14, 17, 34; 327/156, 159; 332/128

[56] References Cited

U.S. PATENT DOCUMENTS 4,980,652 12/1990 Tarusawa et al. ............... 331/1 A

*Primary Examiner*—Stephen Chin
*Assistant Examiner*—Frederick Yu
*Attorney, Agent, or Firm*—Fleshner & Kim

[57] ABSTRACT

A phase locked loop (PLL) circuit forming a closed loop and comprised of a frequency/phase detector, a loop filter, a voltage controlled oscillator and further includes a voltage controlled oscillator controller. The circuit realizes a faster frequency locking and is capable of outputting a variety of frequencies.

6 Claims, 4 Drawing Sheets

PHASE LOCKED LOOP (PLL) CIRCUIT

BACKGROUND OF THE INVENTION

1. Field of the Invention

The present invention relates to a phase locked loop (PLL) circuit, and more particularly to an improved PLL circuit for increasing a locking speed so as to be appropriate to a system which requires a rapid response speed.

2. Description of the Prior Art

As shown in FIG. 1, a conventional PLL circuit includes: a frequency/phase detector 1 for receiving an externally applied input signal Vi and an output signal Vo of a voltage controlled oscillator 3, and outputting either a frequency difference value (error signal) obtained by comparing the frequency of the input signal Vi with the frequency of the output signal Vo, or a phase difference value (error signal) obtained by comparing the phase of the input signal Vi with a phase of the output signal Vo; a loop filter 2 for filtering the output signal of the frequency/phase detector 1; and a voltage controlled oscillator 3 for receiving an output error voltage Ve from the filter 2 and outputting the signal Vo having a predetermined voltage and a frequency controlled by the voltage Ve. Here, the frequency/phase detector 1, the filter 2 and the voltage controlled oscillator 3 are connected in a closed loop.

The operation of the thusly constituted conventional PLL circuit will now be described.

The input signal Vi and the output signal Vo of the voltage controlled oscillator 3 are applied to the frequency/phase detector 1 and therein respective frequencies/phases of the input signal Vi and the output signal Vo are compared with each other. As a result of the comparison, an error signal in accordance with the frequency/phase difference is outputted and filtered in the loop filter 2. The filtered signal Ve is applied to the voltage controlled oscillator 3 which in turn outputs to the frequency/phase detector 1 the signal Vo having a frequency in accordance with the level of the signal Ve.

FIG. 2 shows a graph illustrating a function of time versus frequency with regard to the operation of the frequency/phase detector 1, and as shown therein, reference numeral S1 denotes the frequency of input signal Vi and reference numeral S2 denotes the frequency of output signal Vo, wherein the frequency S2 is locked to the frequency S1. At this time, between a transition time point t1 and t2 the phase of the output signal Vo becomes locked and it is rendered to be an in-phase state with the input signal Vi during the time in which an external system (not shown) receiving output signal Vo is turned to a normal operation.

However, up until the in-phase state, because the frequency and phase of the output signal Vo are not identical to those of the input signal Vi, the external system is not normally operated. Therefore, the longer the locking time, the longer becomes an abnormal operation time of the external system.

SUMMARY OF THE INVENTION

Accordingly, it is an object of the present invention to provide a PLL circuit capable of a prompt frequency/phase locking by using a preset channel frequency.

To achieve the above-described object, there is provided a PLL circuit according to the present invention which includes a frequency/phase detector for receiving an externally applied input signal and an output signal of a voltage controlled oscillator, outputting one of a frequency difference value obtained by comparing a frequency of the input signal with a frequency of the output signal and a phase difference value obtained by comparing a phase of the input signal with a phase of the output signal, a loop filter for filtering an output signal of the frequency/phase detector, a voltage controlled oscillator controller for receiving a plurality N bits of channel data in accordance with a channel frequency, generating a predetermined level signal by converting the channel data, comparing the thusly generated signal and the output signal from the loop filter, and outputting the output signal of the loop filter if the levels of the respective signals are identical and outputting the generated signal if the levels of the respective signals are not identical, and a voltage controlled oscillator for receiving the output signal of the voltage controlled oscillator controller and outputting a fixed level output signal in accordance therewith, wherein the frequency/phase detector, the filter, the voltage controlled oscillator controller, and the voltage controlled oscillator are connected in a closed loop.

DETAILED DESCRIPTION OF THE INVENTION

Figure 1:
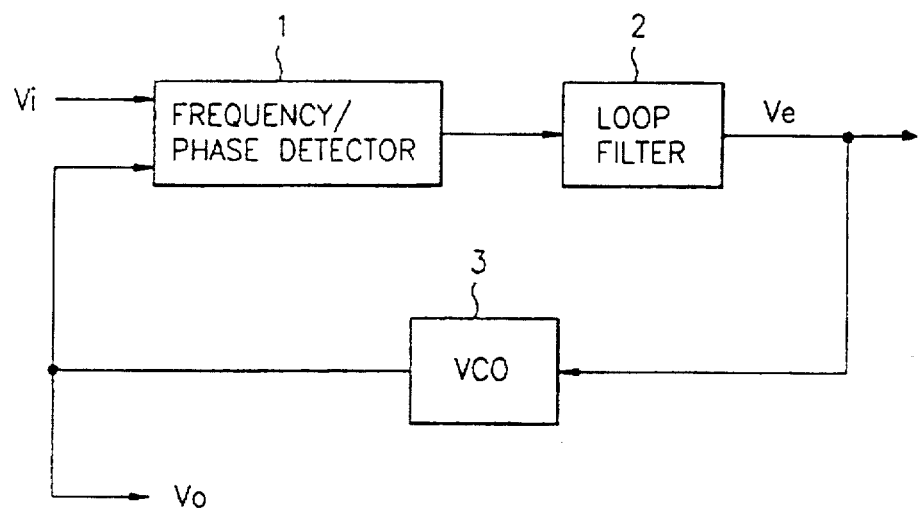
FIG. 1 is a block diagram of a conventional PLL circuit.
Figure 2:
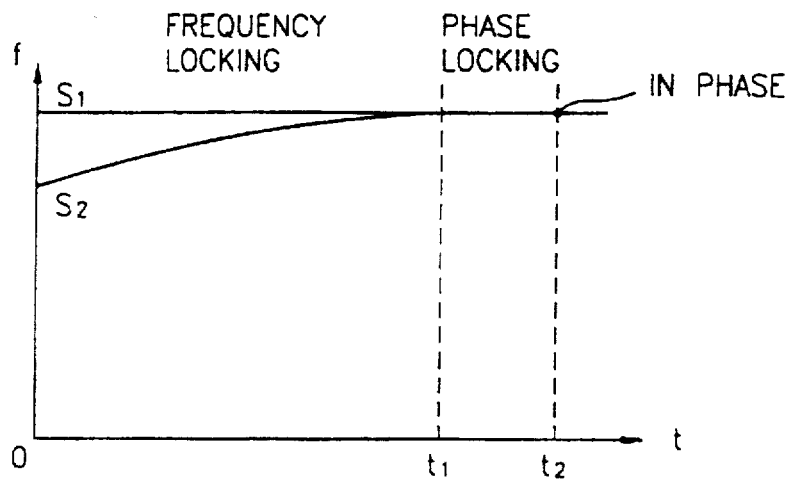
FIG. 2 is a graph illustrating the operation of a frequency/phase detector in the circuit of FIG. 1.
Figure 3:
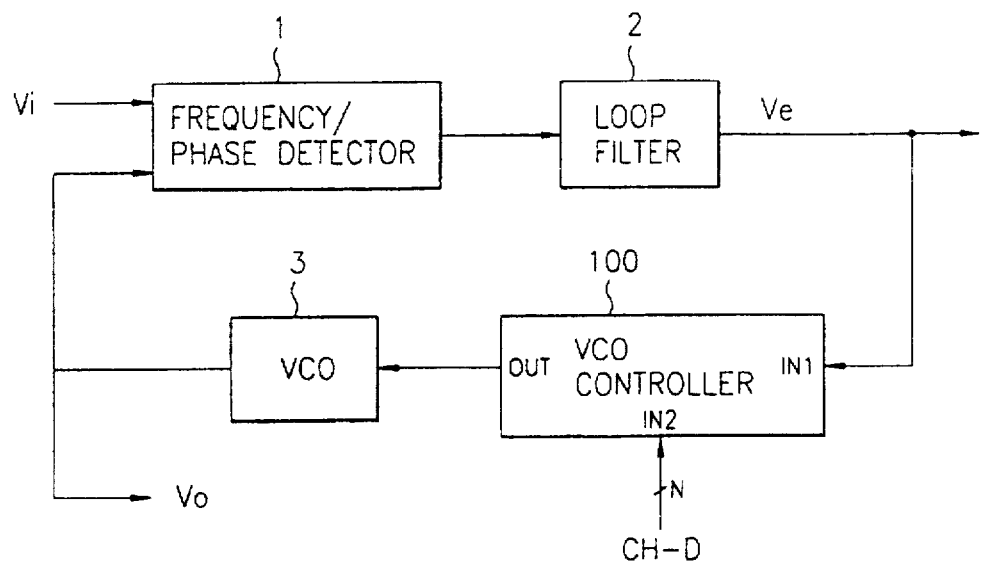
FIG. 3 is a block diagram of a PLL circuit according to a first embodiment of the present invention.

As shown in FIG. 3 illustrating a PLL circuit according to a first embodiment of the present invention, the circuit includes: a frequency/phase detector 1 for receiving an externally applied input signal Vi and an output signal Vo of a voltage controlled oscillator 3, outputting a frequency difference value obtained by comparing a frequency of the input signal Vi with a frequency of the output signal Vo, or outputting a phase difference value obtained by comparing a phase of the input signal Vi with a phase of the output signal Vo; a loop filter 2 for filtering an output value of the frequency/phase detector 1 and outputting a signal Ve; a voltage controlled oscillator controller 100 for receiving a plurality N bits of channel data CH-D in accordance with a channel frequency, generating a predetermined level signal Vd by converting the channel data CH-D, comparing the signal Vd and the output signal Ve of the loop filter 2, and outputting either the signal Ve if the respective levels of the signals Vd and Ve are identical or the signal Vd if the respective levels of the signals Vd and Ve are not identical; and a voltage controlled oscillator 3 for receiving the output signal of the voltage controlled oscillator controller 100 and outputting a predetermined level signal Vo. Here, the frequency/phase detector 1, the filter 2, the voltage controlled oscillator controller 100 and the voltage controlled oscillator 3 are connected in a closed loop.

Figure 4:
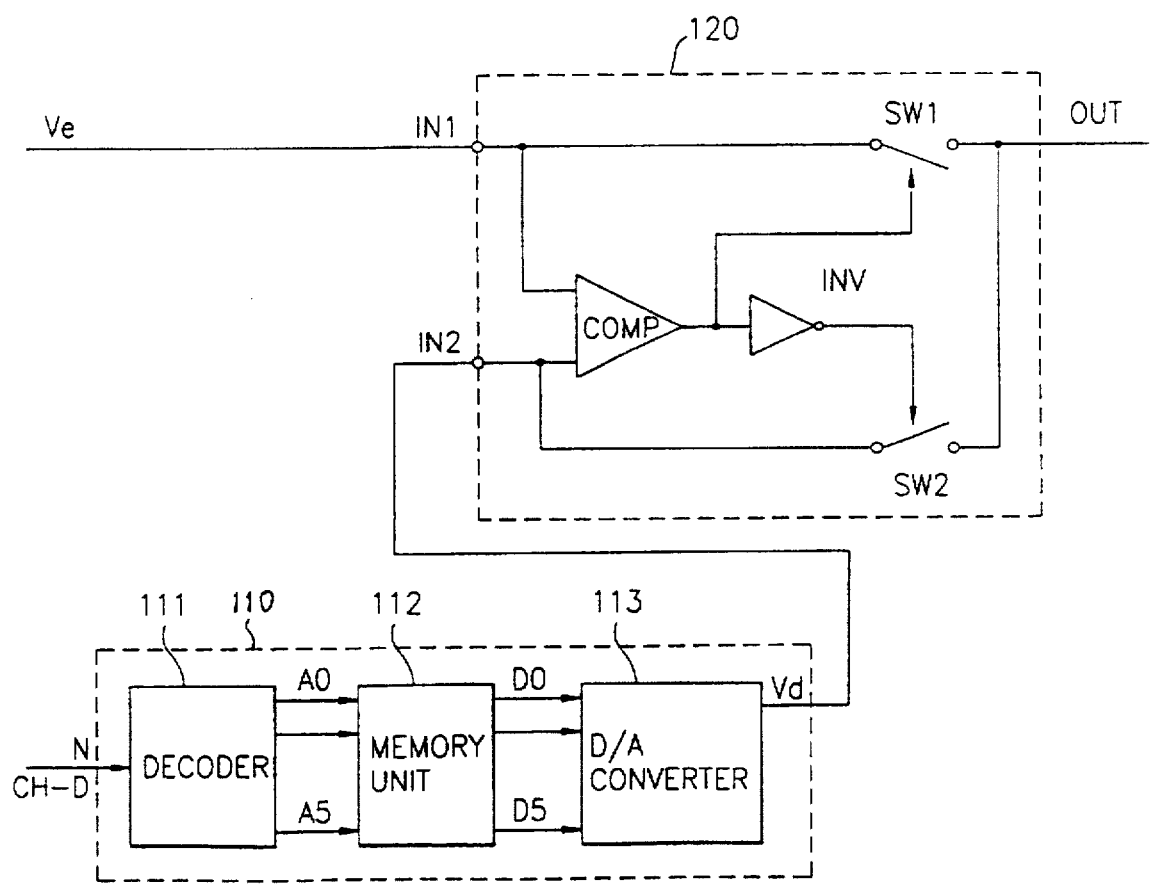
FIG. 4 is a block diagram detailing a voltage controlled oscillator controller in the circuit of FIG. 3.

As further shown in FIG. 4, the voltage controlled oscillator controller 100 includes: a voltage setting unit 110 for receiving a plurality N bits of channel data CH-D in accordance with a channel frequency, and outputting a predetermined level signal Vd in accordance with a VCO characteristic; and a comparison unit 120 for comparing respective levels of output signal Vd from the voltage setting unit 110 and output signal Ve from the loop filter 2, and outputting either the signal Ve if the respective levels of the signals Vd, Ve are identical or the signal Vd if the respective levels of the signals Vd, Ve are not identical.

The voltage setting unit 110 includes a decoder 111 for decoding the channel data CH-D, a memory unit 112 for outputting preset voltage values v1, v2, . . . , $v_n$ in accordance with decoded values f1, f2, . . . , $f_n$ respectively, and a digital/analog converter 113 for converting the output voltage values v1, v2, . . . , $v_n$ from the memory unit 112 respectively to an analog signal Vd.

The comparison unit 120 includes a comparator COMP for comparing the level of an output signal Vd from the voltage setting unit 110 and the level of the output signal Ve from the loop filter 2, a first switch SW1 for transmitting to the voltage controlled oscillator 3 or blocking the output signal Ve from the loop filter 2 in accordance with an output signal of the comparator COMP, an inverter INV for inverting the level of the output signal of the comparator COMP, and a second switch SW2 for transmitting to the voltage controlled oscillator 3 or blocking the output signal Vd from the voltage setting unit 110 in accordance with an output signal of the inverter INV.

The operation of the thusly constituted PLL circuit according to the first embodiment of the present invention will now be described.

Respective frequencies/phases of an externally applied signal Vi and an output signal Vo from the voltage controlled oscillator 3 are compared in the frequency/phase detector 1. As a result of the comparison, an error signal is outputted in accordance with a frequency/phase difference. The loop filter 2 filters the error signal, and the filtered error signal Ve is applied to an input terminal IN1 of the voltage controlled oscillator controller 100.

The channel data CH-D is applied to the decoder 111 in the voltage setting unit 110 of the voltage controlled oscillator controller 100 in accordance with the channel frequency. The channel data CH-D is decoded and the decoded address value A is applied to the memory unit 112.

At this time, if the channel data is composed of 32 bits, the number of address signals A being applied to the memory unit 112 numbers six. The memory unit 112 secures 32 memory regions to correspond to the six address signals.

Figure 5:
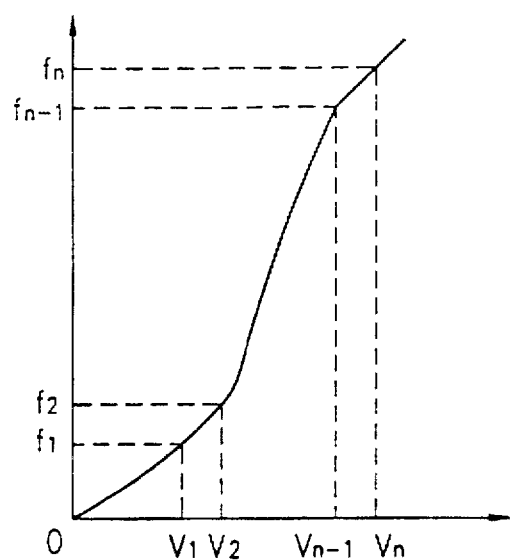
FIG. 5 is a graph showing a voltage controlled oscillator characteristic and illustrating the relation between input frequency and output voltage for explaining the operation of a voltage setting unit in the circuit of FIG. 4.

FIG. 5 shows a VCO characteristic of the memory unit 112 and the relation between frequency fi and voltage vi. Therein, reference numeral fi denotes the channel frequency corresponding to channel data CH-D, and reference numeral vi denotes the output voltage value corresponding to the channel frequency fi.

The address signal A outputted from the decoder 111 designates a specific memory region of the memory unit 112, and a data signal value Di stored in the designated memory region is outputted. Here, the data value Di is a digital value mapped by frequency.

The D/A converter 113 serves to decode the value Di and outputs a predetermined magnitude of analog voltage Vd accordingly.

When a certain channel frequency is applied to the voltage setting unit, a predetermined magnitude signal Vd corresponding to the channel frequency is outputted.

The signal Vd is applied via an input terminal IN2 to the comparator COMP of the comparison unit 120.

The comparator COMP compares respective levels of the signal Vd and the output signal Ve which is applied from the loop filter 2 to the input terminal IN1, and outputs a low level signal if the two signals are identical in level and a high level signal if the two signals are not identical.

The first switch SW1 in the comparison unit 120 is provided between the loop filter 2 and the voltage controlled oscillator 3, the second switch SW2 is provided between the voltage setting unit 110 and the voltage controlled oscillator 3, and the pair of switches SW1, SW2 are respectively closed when control signals controlling the switches SW1, SW2 are at a high level, and they are opened when the control signals are at a low level.

If the output signal of the comparator COMP is at a 'high' level, the switch SW1 connecting the input terminal IN1 and the output terminal OUT becomes closed. The 'high' level output signal of the comparator COMP is inverted in inverter INV to thereby open the switch SW1, and the output signal Ve of the loop filter 2 is applied to the voltage controlled oscillator 3 in accordance therewith.

To the contrary, if the output signal of the comparator COMP is at a 'low' level, the switch SW1 becomes opened. The 'low' level output signal of the comparator COMP is inverted in the inverter INV to thereby close the switch SW2, and the output signal Vd of the digital/analog converter 113 is applied to the voltage controlled oscillator 3 in accordance therewith.

That the switch SW1 is closed means that the output frequency is locked in accordance with the PLL loop, and that the switch SW2 is closed means that the output frequency is forcibly locked by the channel frequency.

The voltage controlled oscillator 3 receives the signals Vd or Ve outputted from the output terminal of the voltage controlled oscillator controller 100, and outputs the signal Vo having a frequency in accordance therewith. The signal Vo is fed back to the frequency/phase detector 1.

Figure 6:
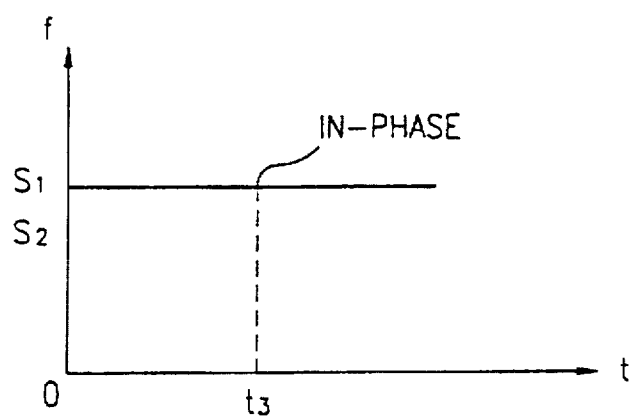
FIG. 6 is a graph illustrating the operation of the frequency/phase detector in the circuit of FIG. 3.

FIG. 6 illustrates the operation of the frequency/phase detector 1 by a frequency graph and by comparison with FIG. 3, it can be easily understood that the output frequency is locked from the beginning.

Figure 7:
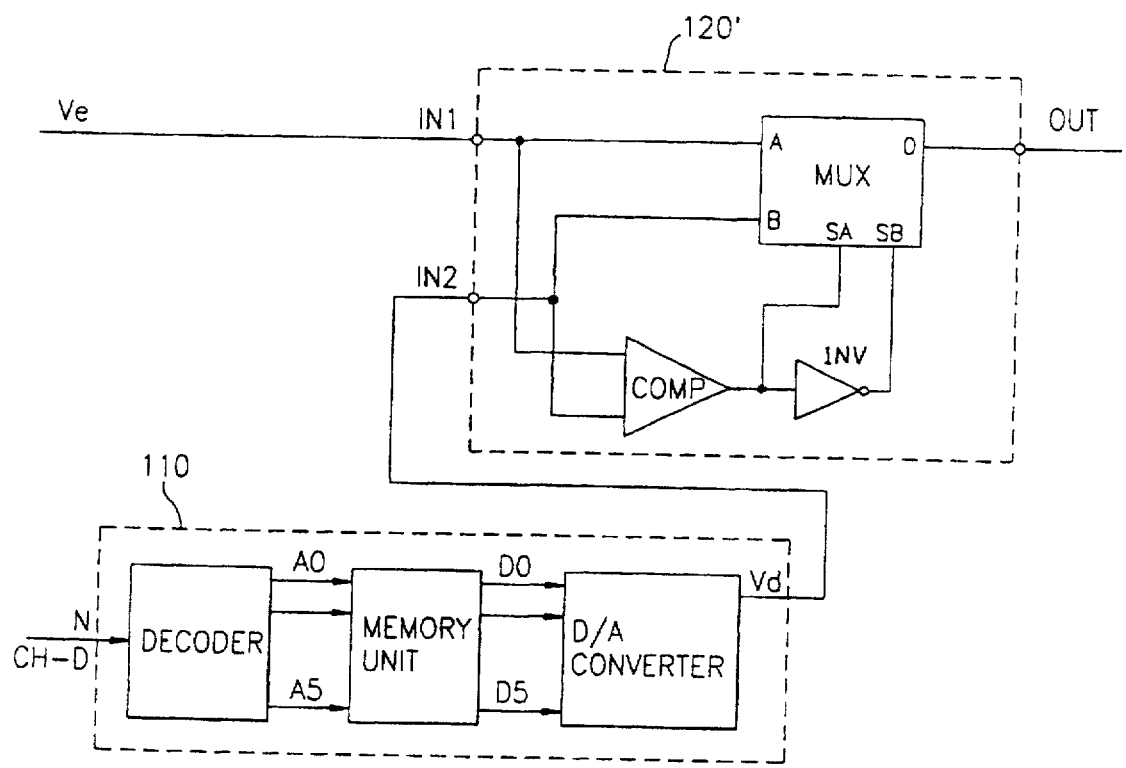
FIG. 7 is a modified block diagram detailing the voltage controlled oscillator controller in the circuit of FIG. 3.

Referring to FIG. 7 illustrating a second embodiment of the voltage controlled oscillator controller 100 in FIG. 3, the controller 100 includes a voltage setting unit 110, and a comparison unit 120', wherein the voltage setting unit 110 is identical in composition to that of the first embodiment according to the present invention.

The comparison unit 120' includes: a comparator COMP for comparing the level of the output signal Ve applied thereto via input terminal IN1 from the loop filter 2 and the level of the output signal Vd applied thereto via input terminal IN2 from the voltage setting unit 110; an inverter INV for inverting an output signal level of the comparator COMP; and a multiplexer MUX for receiving the output signal Ve and the output signal Vd respectively through input terminals A, B, and also receiving the output signal of the comparator COMP through a control terminal SA and an output signal of the inverter INV through a control terminal SB, and selectively outputting a signal selected from the signals Ve and Vd which are applied to the input terminals A, B in accordance with a logic state of the signals applied to the SA and SB selection control terminals. Here, the output of the multiplexer MUX is applied to the voltage controlled oscillator 3 through an output terminal OUT.

The thusly composed multiplexer MUX is operated identically in function to the switches SW1, SW2 which are employed in the comparison unit 120 of the first embodiment.

The two switches SW1, SW2 are employed to explain the principle of operation of the present invention, and the above-described multiplexer MUX serves as a practical application.

Figure 8:
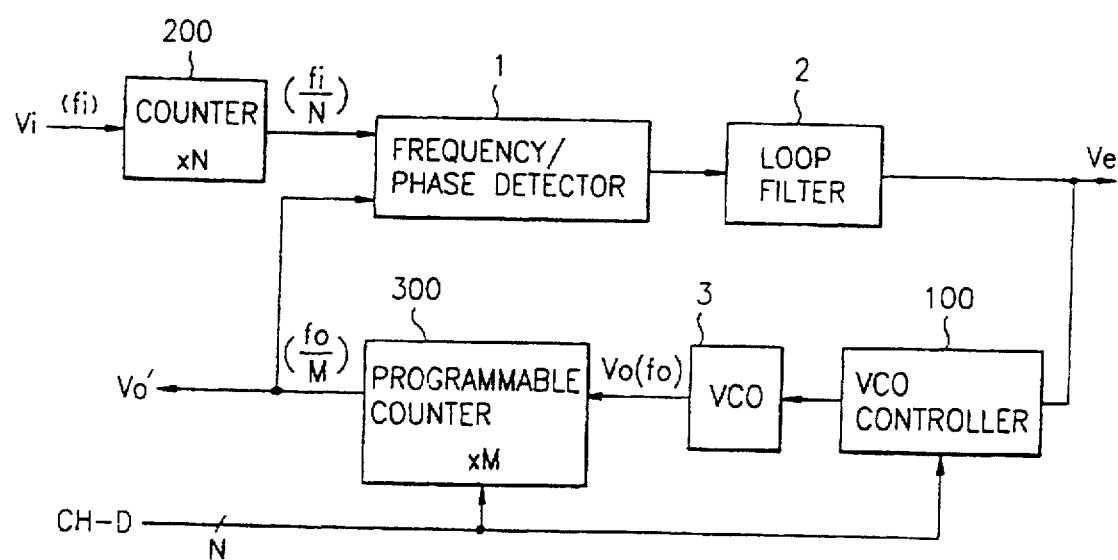
FIG. 8 is a block diagram of a PLL circuit according to a second embodiment of the present invention.

As shown in FIG. 8 illustrating a PLL circuit according to a second embodiment of the present invention, the circuit includes: a frequency/phase detector 1; a loop filter 2; a voltage controlled oscillator controller 100; a voltage controlled oscillator 3; and a counter 200 for dividing a frequency fi of the input signal Vi by a value N and outputting the input signal Vi having an N times divided frequency fi/N to the frequency/phase detector 1; and a programmable counter 300 for receiving channel data CH-D corresponding to a channel frequency, dividing by value M the frequency fo of the output signal Vo outputted from the voltage controlled oscillator 3, and outputting the divided frequency fo/M to the frequency/phase detector 1.

The counter 200 divides the frequency fi of the input signal Vi by N, and outputs to the frequency/phase detector 1 a signal having a phase identical to the input signal Vi and a frequency of fi/N.

The programmable counter 300 divides the frequency fo of the output signal Vo by M, and outputs to the frequency/phase detector 1 a signal Vo' having a phase identical to the input signal Vo and a frequency of fo/N.

The frequency/phase detector 1 compares the two frequencies fi/N, fo/M, and the input frequency fi and the output frequency fo after locking has the relation as expressed in the following equation.

$$fo = \frac{M}{N} fi$$

Here, in order to make the output frequency fo double the input frequency fi, the value M/N can be set to be '2'. As described above, in the PLL circuit according to the first embodiment of the present invention, a voltage Vd corresponding to a channel frequency is generated, the respective magnitudes of the voltage Vd and the voltage Ve outputted from the loop filter 2 are compared, and then in accordance with the compared result the voltage being applied to the voltage controlled oscillator 3 is determined, whereby the output frequency is locked each time the loop operation is carried out for thereby locking the output frequency in a shorter time.

Further, the second embodiment of the present invention additionally includes the counter 200 and the programmable counter 300, and an output frequency having a predetermined relation to the frequency of the input signal Vi is outputted, thereby realizing a faster frequency locking in a PLL circuit capable of outputting a variety of frequencies.

What is claimed is:

1. A phase locked loop (PLL) circuit, comprising:

a frequency/phase detector for receiving an externally applied input signal and an output signal of a voltage controlled oscillator and outputting a frequency/phase difference signal obtained by comparing a frequency/phase of the input signal with a frequency/phase of the output signal;

a loop filter for filtering the output signal of the frequency/phase detector;

a voltage controlled oscillator controller for receiving a plurality N bits of channel data in accordance with a channel frequency, generating a predetermined level signal by converting the channel data, comparing the thusly generated signal and an output signal from the loop filter, and outputting the output signal from the loop filter when the levels of the generated signal and the output signal from the loop filter are identical and outputting the generated signal when levels of the generated signal and the output signal from the loop filter are not identical; and a voltage controlled oscillator for receiving the output signal from the voltage controlled oscillator controller and outputting a signal having a frequency in accordance therewith, wherein the frequency/phase detector, the loop filter, the voltage controlled oscillator controller, and the voltage controlled oscillator are connected in a closed loop.

2. The circuit of claim 1, wherein the voltage controlled oscillator controller comprises:

a voltage setting unit for receiving a plurality N bits of channel data in accordance with a channel frequency, and outputting a predetermined level signal in accordance therewith; and a comparison unit for comparing respective levels of the output signal from the voltage setting unit and the output signal from the loop filter, and outputting the output signal from the voltage setting unit when the respective levels of the output signals from the voltage setting unit and the loop filter are not identical and outputting the output signal from the loop filter when the respective levels of the signals outputted from the voltage setting unit and the loop filter are identical.

3. The circuit of claim 2, wherein the voltage setting unit comprises:

a decoder for decoding the channel data;

a memory unit for outputting preset voltage values v1, v2, ...., $v_n$ in accordance with decoded values f1, f2, ...., $f_n$ of the channel data respectively; and a digital/analog converter for converting the output voltage values v1, v2, ...., $v_n$ from the memory unit respectively into analog voltage signals.

4. The circuit of claim 2, wherein the comparison unit comprises:

a comparator for comparing the level of the output signal from the voltage setting unit and the level of the output signal from the loop filter;

a first switch for transmitting to the voltage controlled oscillator or blocking the output signal from the loop filter in accordance with an output signal of the comparator;

an inverter for inverting the output signal of the comparator; and a second switch for transmitting to the voltage controlled oscillator or blocking the output signal from the voltage setting unit in accordance with an output signal of the inverter.

5. The circuit of claim 2, wherein the comparison unit comprises:

a comparator for comparing the level of the output signal from the loop filter applied thereto via an input terminal and the level of the output signal from the voltage setting unit applied thereto via another input terminal;

an inverter for inverting an output signal of the comparator; and a multiplexer for receiving the output signals from the loop filter and the voltage setting unit respectively through a pair of input terminals, and also receiving an output signal of the comparator through a first control terminal and an output signal of the inverter through a second control terminal, and selectively outputting a signal selected from the respective signals from the loop filter and the voltage setting unit which are applied to the input terminals in accordance with a logic state of the signals applied to the first and second control terminals, wherein an output signal of the multiplexer is applied through an output terminal thereof to the voltage controlled oscillator.

6. The circuit of claim 1, further comprising:

a counter for dividing a frequency fi of the input signal by a value N and outputting the frequency-divided input signal fi/N to the frequency/phase detector; and a programmable counter for receiving channel data corresponding to a channel frequency, dividing by a value M the frequency fo of the output signal outputted from the voltage controlled oscillator, and outputting a divided frequency signal fo/M to the frequency/phase detector.

* * * * *

UNITED STATES PATENT AND TRADEMARK OFFICE
CERTIFICATE OF CORRECTION

PATENT NO. : 5,761,258
DATED : June 2, 1998
INVENTOR(S) : Yong Won Lee

It is certified that error appears in the above-identified patent and that said Letters Patent is hereby corrected as shown below:

Title page, item [54] and col. change the Title to read --PHASE LOCKED LOOP (PLL) CIRCUIT --.

item [30] Foreign Appliction Priority Data, change "Aug. 5, 1996" to --May 8, 1996--

Signed and Sealed this

Thirtieth Day of May, 2000

Attest:

Q. TODD DICKINSON

*Attesting Officer*   *Director of Patents and Trademarks*